United States Patent [19]

Nakajima et al.

[11] Patent Number: 5,408,111
[45] Date of Patent: Apr. 18, 1995

[54] FIELD-EFFECT TRANSISTOR HAVING A DOUBLE PULSE-DOPED STRUCTURE

[75] Inventors: Shigeru Nakajima; Hideki Hayashi, both of Yokohama, Japan

[73] Assignee: Sumitomo Electric Industries, Ltd., Japan

[21] Appl. No.: 25,410

[22] Filed: Feb. 26, 1993

[51] Int. Cl.6 .................... H01L 29/804; H01L 29/812
[52] U.S. Cl. ..................................... 257/192; 257/194; 257/27
[58] Field of Search .................... 257/192, 194, 27, 20, 257/24, 25, 14

[56] References Cited

U.S. PATENT DOCUMENTS

| | | | |
|---|---|---|---|
| 4,855,797 | 8/1989 | Kohn et al. | 257/194 |
| 5,140,386 | 8/1992 | Huang et al. | 257/194 |
| 5,285,087 | 2/1994 | Narita et al. | 257/194 |

FOREIGN PATENT DOCUMENTS 308965 12/1988 Japan ........................... 257/194
4109633 4/1992 Japan ........................... 257/194

OTHER PUBLICATIONS

"High Efficiency Millimeter Wave GaAs/GaAlAs Power Hemt's " Saunier et al, IEEE electron device letters, vol. EDL-7, No. 9, Sep. 1986.

*Primary Examiner*—Rolf Hille
*Assistant Examiner*—Wael M. Fahmy
*Attorney, Agent, or Firm*—Beveridge, DeGrandi, Weilacher & Young

[57] ABSTRACT

A buffer layer, a first undoped layer, a first active layer and second undoped layer, a second active layer, a third undoped layer, a cap layer and contact layers are epitaxially grown on a semiconductor substrate in the stated order. A gate electrode is formed in a recess etched groove which formed in the center and reaches the cap layer through the contact layers. A drain electrode and a source electrode are formed on the contact layers and on both sides of the gate electrode.

21 Claims, 11 Drawing Sheets

FIELD-EFFECT TRANSISTOR HAVING A DOUBLE PULSE-DOPED STRUCTURE

BACKGROUND OF THE INVENTION

1. Field of the invention

This invention relates to a field effect transister.

2. Related Background Art

We presented a device which can realize low-noise characteristics which are compatible with those of Al-GaAs/GaAs-based HEMTs in "Double Pulse-Doped Channel GaAs MESFETs" at 1991 Autumn National Convention of Institute of Electronics and Communication Engineers which was held on Aug. 15, 1991. This MESFET comprises on an S.I. GaAs substrate a 2 μm-thickness p− GaAs buffer layer, a 50 Å-thickness n+ GaAs pulse-doped layer having an impurity concentration of $2 \times 10^{18}/cm^3$, a 100 Å-thickness intentionally-undoped n− GaAs intermediate layer, a 50 Å-thickness n+ pulse-doped layers of an impurity concentration of $2 \times 10^{18}/cm^3$, an n− GaAs gap layer ($1 \times 10^{17}/cm^3$, 400 Å), and n+ GaAs contact layers ($4 \times 10^{18}/cm^3$, 1000 Å), which are deposited one on another in the stated order, and has a recess structure in which the cap layer for the channel region is exposed.

SUMMARY OF THE INVENTION

The device according to this invention is the same as the above-described prior art MESFET presented by the inventors in that an intentionally-undoped intermediate layer is disposed between two pulse-doped layers. In such structure, wave functions of the electrons in the two pulse-doped layers interfere with each other, whereby electrons are present also in the undoped intermediate layer. The electrons are less diffused in the undoped intermediate layer than in the pulse-doped layers. Accordingly, the devices can have an improved electron mobility, and improved electron transfer characteristics.

But the prior art structure in which the pulse-doped layers have a thickness of 50 Å, and the intermediate layer has a thickness of 100 Å has found it difficult to give MESFETs high gains, high-speed operations, high outputs at high fabrication yields. A major object of this invention is to overcome such disadvantage, and is characterized in that the two pulse-doped layers each have a thickness of 60-200 Å, and the intermediate layer has a thickness of 50-300 Å, most preferably the pulse-doped layers each have a thickness 100 Å, and the intermediate layer has a thickness of 100 Å.

Our prior art device and our device according to this invention appear similar, but structural differences between the two devices make large differences in usefulness of MESFETs. In the planar doped structure having the conductor layer whose thickness is about some Å, and also in the pulse-doped structure having the conductor layer whose thickness is about 10S-100S Å, carrier electrons cannot stay only in the doped layer, and a part of the electrons are present in the undoped layer (the intermediate layer, etc. in this invention) which is adjacent to the doped layer. The electrons present in the intermediate layer play an important to enhance role in the improvement of characteristics of MESFETs. To enhance the practicability and usefulness of MESFETS, it is necessary to satisfy the following two conditions.

1) A ratio of the electrons generated in the pulse-doped layers which leak out into the intermediate layer is high.

2) A large number of electrons are generated in the pulse-doped layer themselves.

To satisfy the condition 1), it is preferable that each doped layer is thin as much as possible, idealistically the pulse-doped layer has a single atom film 5–6 Å. Accordingly our prior art device having each pulse-doped layer of 50 Å is more preferable than the device according to this invention having each pulse-doped layer of 60–200 Å. But as a thickness of the pulse-doped layers is decreased, a total number of donors as the electron generating source is decreased by a decrease of the thickness, and naturally a total number of the generated electrons is considered to decrease. That is, the two conditions 1) and 2) are inconsistent with each other. According to the our prior art device (each pulse-doped layer: 50 Å), a ratio of the electrons in the intermediate layer, which contribute to the characteristics improvement, rises, but a total number of the electrons decreases. According to the device of this invention (each pulse-doped layer $\geq 60$ Å), a ratio of the electrons in the intermediate layer lowers, but a total number of the electrons increases.

But, according to our studies, when each pulse-doped layer is formed in a thickness above 60 Å, a larger increase of a total electron number than expected can be obtained. To be specific, since a total number of electrons is considered to increase in proportion with a thickness of each pulse-doped layer, when a thickness of each pulse-doped layers is increased from $X_1$ Å to $X_2$ Å, the total electron number is expected to be $X_2/X_1$ times. Actually, however, such relationship does not hold; when the thickness exceeds 60 Å, an increase ratio of a total number of electrons rises. That is, an activation ratio of a dopant in each pulse-doped layer having an impurity concentration of about $2 \times 10^{18}/cm^3$ differs depending on a thickness of the pulse-doped layer. When a thickness of the pulse-doped layer exceeds 60 Å, the dopant is activated by a higher ratio, whereby an increase of a total number of electrons is obtained. Whether the pulse-doped layer has a thickness 50 Å or a thickness above 60 Å makes a significant difference in terms of increase electrons in the intermediate layer which contribute to the improvement of electron transfer characteristics.

Forming the pulse-doped layer in a thickness above 60 Å is very significant in terms of the reliability of the fabrication process. That is, in the case where the pulse-doped layer has a thickness of Å, the layer is considered to have 10–12 atom layers (a single atom film has a thickness of 5–6 Å). It is very difficult to accurately control a thickness of such very thin film, and especially in the case where the thickness is below about 50 Å, the thickness is not homogeneous, with the result that "fluctuations" of the presence of the electrons tend to occur. The accurate control of a film thickness becomes easier as the thickness is larger. The difficulty of the accurate control largely differs around 50–60 Å. That is, making the thickness of the pulse-doped layer above 60 Å contributes to the easy fabrication, and the stability of characteristics of the device and the reliability of the device.

The thickness of 60 Å agrees with the diffusion of electrons in the doped layer of a single atom film. Based on this, according to this invention, a range of diffusion of the electrons of a single atom layer is used as a pulse-doped layer, and the electrons of high mobility diffused to the intermediate layers, etc. from the pulse-doped layers of 10–10S of this atom films are used for the improvement of electron transfer characteristics. When each pulse-doped layer has a thickness above 200 Å, a ratio of those of a total number of electrons in the intermediate layer is too low, with the result of unsatisfactory electron transfer characteristics. When the intermediate layer has a thickness below 50 Å, a ratio of the electron present in the intermediate layer is too low. A thickness of the pulse-doped layers above 300 Å does not result in better electron transfer characteristics.

It will be explained with reference to FIG. 1 that the MESFET according to this invention can provide characteristics of high speeds, high outputs and high gains. FIG. 1(a) shows a sectional view of the MESFET near the channel. A buffer layer is formed of $P^-$ GaAs. Two pulse-doped layers are formed of $n^+$ GaAs which respectively have a thickness of 60–200 Å. An intermediate layer is formed of $n^-$ GaAs and has a thickness of 50–300 Å. A cap layer is formed of $n^-$ GaAs, and a gate electrode is formed on the cap layer in Schottky junction. In this case, the conduction band Ec has a V-shape, but since the buffer layer is $p^-$ type. Because the buffer layer is $p^-$ type, the conduction band Ec rises on the left side of FIG. 1(a).

The electrons can be present not only in the ground level, but also in a plurality of sub-bands, but in FIG. 1(a) the electrons are shown in the ground and the second levels. As indicated by the dot line in FIG. 1(b), the presence probability of the electrons in the ground level is high in the potential wells. In the second level, however, the electron presence probability is high on both sides of the centers of the potential wells. In the ground state, and the state where a low voltage is applied between the source and the drain, many of the electrons are in the ground state, and a total electron presence probability is as shown in FIG. 1(c). That is, some percentage of all the electrons are present in the intermediate layer, but because of little diffusion of the electrons in the second level due to impurities, the electron mobility is high, which contributes to higher electron transfer characteristics. In the state where a high voltage is applied between the source and the drain, more of the electrons in the ground state transfer to the second level, but the electrons in the ground state transfer to the other levels. A total electron presence probability is as shown in FIG. 1(e), and a high ratio of the electrons is present in the intermediate layer. As a result, an electron saturation rate is not deteriorated, and good FET characteristics can be obtained.

According to this invention, the two pulse-doped layers each have a thickness of 60–200 Å, and the intermediate layer has a thickness of 50–300 Å, whereby the improvement of electron transfer characteristics by the electrons present in the intermediate layer is maximized.

That is, a FET according to this invention comprises:

a first semiconductor layer epitaxially grown, and containing substantially no impurity;

a second semiconductor layer epitaxially grown on the first semiconductor layer, substantially lattice-matched with the first semiconductor layer, containing in a high concentration an impurity which makes the second semiconductor layer n type conduction, and having a thickness above 60 Å;

a third semiconductor layer epitaxially grown on the second semiconductor layer, substantially lattice-matched with the second semiconductor layer, and containing substantially no impurity;

a fourth semiconductor layer epitaxially grown on the third semiconductor layer, substantially lattice-matched with the third semiconductor layer, containing in a high concentration an impurity which makes the fourth semiconductor layer n type conduction, and having a thickness above 60 Å;

a fifth semiconductor layer epitaxially grown on the fourth semiconductor layer, substantially lattice-matched with the fourth semiconductor layer, and containing substantially no impurity;

a gate electrode;

a source electrode and a drain electrode electrically uncoupled with the gate electrode, and sandwiching the gate electrode.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art form this detailed description.

DESCRIPTION OF THE PREFERRED EMBODIMENTS

Figure 2:
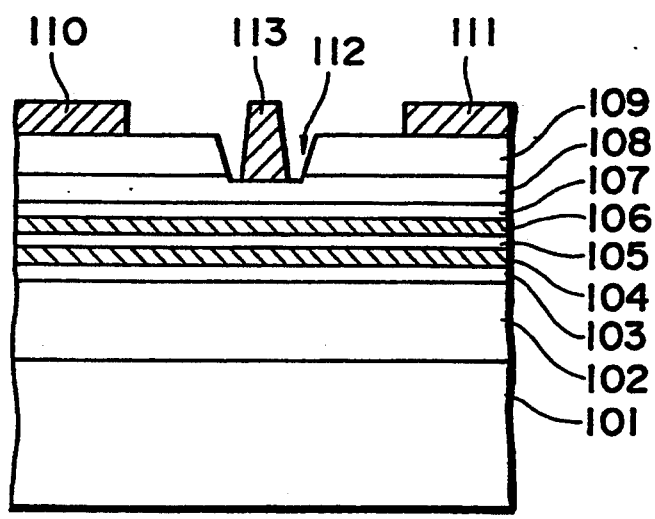
FIG. 2 is a sectional view of the FET according to a first embodiment of this invention having a recess structure.

FIG. 2 shows the structure of the FET according to a first embodiment of this invention. Its fabrication process is shown in sectional views of the FET according to the first embodiment in the respective steps.

Figure 1:
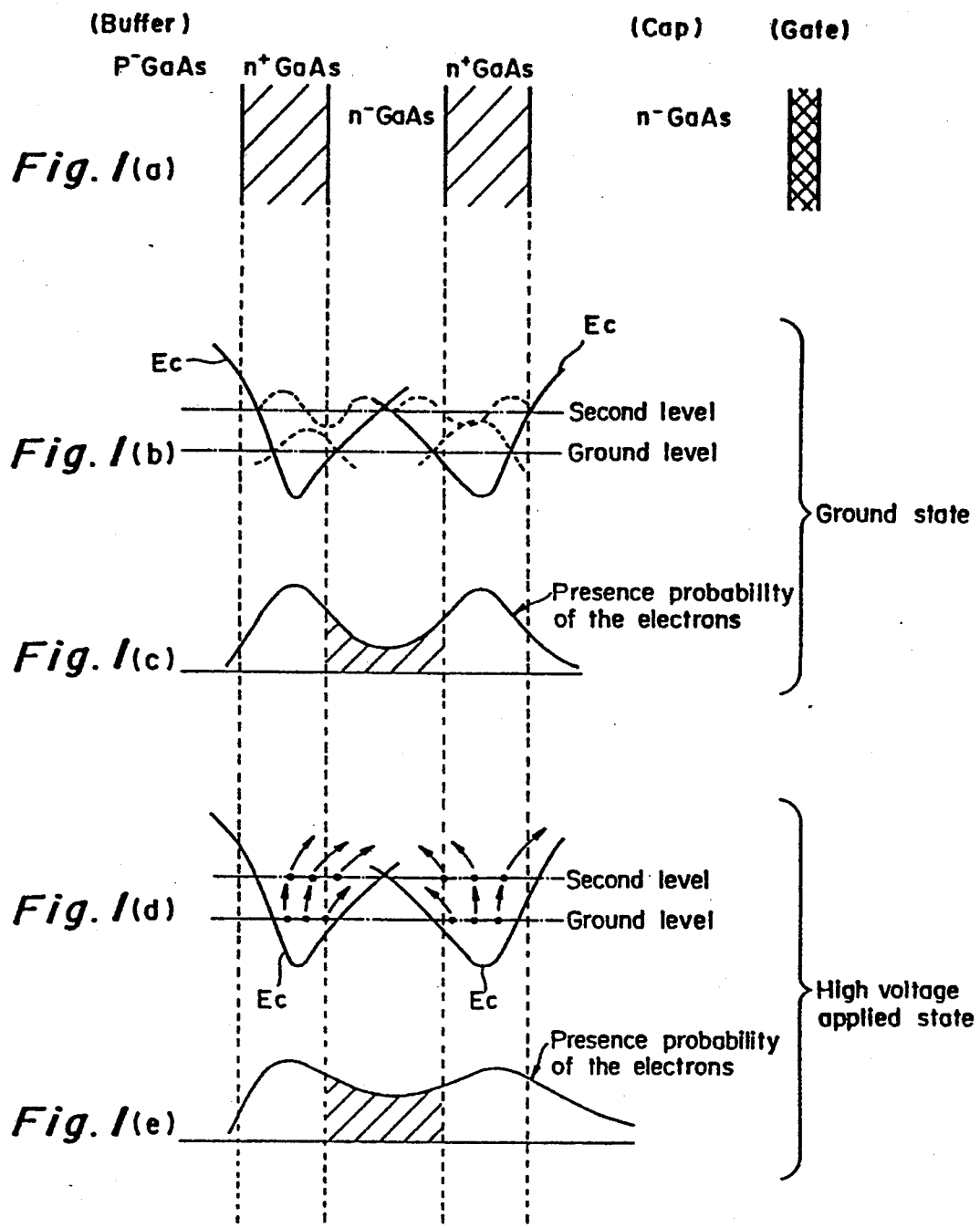
FIG. 1a–1e are a sectional structural view of the channel area of the FET according to this invention, and views of relationships between the structure of the channel area and electron presence probabilities.

The structure of the FET according to the first embodiment will be explained with reference to FIG. 1.

A buffer layer 102, a first undoped layer 103, a first active layer 104 and second undoped layer 105, a second active layer 106, a third undoped layer 107, a cap layer 108 and contact layers 109 are epitaxially grown on a semiconductor substrate 101 in the stated order. A gate electrode 113 is formed in a recess etched groove 112 which formed in the center and reaches the cap layer 108 through the contact layers 109. A drain electrode 110 and a source electrode 111 are formed on the contact layers 109 and on both sides of the gate electrode 113.

Then the respective layers will be explained. The semiconductor substrate 101 is formed of semi-insulating (S. I.) InP. The buffer layer 102, which is for the lattice matching, is formed of undoped AlInAs and has a 1 $\mu$m-thickness. The first undoped layer 103 is formed of undoped $In_yGa_{1-y}As$ ($0.45 \leq Y \leq 0.65$) and has a thickness of 100 Å. The first undoped layer 103 is not doped with any impurities intentionally, that is, an intentionally undoped layer. But, the first undoped layer 103 preferably has $p^-$ type as background conduction type (background $p^-$ conduction; carrier concentration: below $5 \times 10^{16}/cm^3$).

The first active layer 104 and the second active layer 106 are formed of $n^+$ $In_yGa_{1-y}As$ ($0.45 \leq y \leq 0.65$) doped with Si respectively in a concentration of $2 \times 10^{18}/cm^3$, and respectively have a thickness of 100 Å. These active layers have a thickness large enough to form quantum wells. Specifically, their thickness may be 60-200 Å, preferably 100 Å.

The second undoped layer 105 sandwiched by the active layers 104, 106 is formed of undoped $In_yGa_{1-y}As$ ($0.45 \leq y \leq 0.65$) which is superior to the active layers 104, 106 in electron transfer characteristic. This second undoped layer 105 has a thickness which is sufficient to efficiently transfer electrons and allows the active layers 104, 106 to function as a substantially single channel layer without isolating the two active layers 104, 106. Specifically the thickness of the second undoped layer 105 may be 50-300 Å, preferably 100 Å.

The third undoped layer 107 on the second active layer 106 is formed of the same material as the second undoped layer 105, and has a 100 Å-thickness. The second and the third undoped layer 105, 107 are intentionally-undoped layers, but preferably have background $n^{31}$ conduction (carrier concentration: below $5 \times 10^{15}/cm^3$).

The cap layer 108 having a hetero-junction with the third undoped layer 107 is formed of undoped $Al_xIn_{1-x}As$ ($0.423 \, x \leq 0.6$) and has a 200 Å-thickness. The gate electrode 113 is formed on this cap layer 108 in Schottky junction.

The contact layers 109 on the cap layer 108 are formed of $n^+$ InGaAs doped in a $4 \times 10^{18}/cm^3$-concentration, and has thickness of 500 Å.

The first active layer 104, the second undoped layer 105, the second active layer 106, the third undoped layer 107 and the cap layer 108 respectively satisfy the above-mentioned conditions on the layer thickness while they are thin enough for a total thickness of their layer thicknesses to satisfy FET operating characteristics. The cap layer 108 between the gate electrode 113 and the third undoped layer 107 has a thickness which does not allow a current to flow from the gate electrode 113 due to the tunnel effect. The uppermost contact layers 109 are for the protection of the substrate surface and the ohmic contact with a drain and a source electrodes which will be explained later, and is irrelevant to the substance of this invention.

In this structure, when a low voltage is applied between the drain electrode 110 and the source electrode 111, a low-intensity electric field is applied to the electrons in the active layers 104, 106. The electrons freed from the active layers 104, 106 are present with high probability in the undoped layer 105 between the active layers 104, 106. The electrons in the second undoped layer 105 can transfer at higher speed.

As the voltage between the drain electrode 110 and the source electrode 111 is increased, the electric field in the active layers 104, 106 increases its intensity. As a result, the electrons in the active layers transfer not only to the second undoped layer 105, but also to the first undoped layer 103 and the third undoped layer 107. The electrons can transfer there at high speed, because the semiconductor layers 103, 105, 107, which are undoped, have good electron transfer characteristics. Accordingly their electron saturation speeds are not deteriorated.

At this time, a larger number of the electrons transfer to the third undoped layer 107 than to the first undoped layer 103.

Because, by the background p-conduction of the first undoped layer 103, and the background $n^-$ conduction of the second and the third undoped layers 104, 106, more carriers can be present on the side of the upper surface of the substrate, i.e., the side of the gate electrode 113. As a result, the electrons transfer mainly in the second undoped layer 105 and the third undoped layer 107, and good control by a gate voltage can be obtained.

Thus, according to this embodiment, although the heavily-doped active layers 104, 106, which are susceptible to the influence of impurity diffusion, are used, the electrons can transfer over the entire range from parts where an electric field has a higher intensity and to parts where the electric field has a lower intensity. Thus, the FET according to this invention exhibits high-frequency characteristics equal to or better than those of HEMTs, and has a cut-off frequency $f_t$ and a maximum oscillation frequency $f_{max}$ which are less deteriorated in comparison with HEMTs. Higher electron mobilities at low-intensity electric fields can be available, and accordingly the source parasitic resistance Rs of the FET, which is influenced by electron mobilities at low-intensity electric fields, has lower values. Since high electron transfer speed is available over the entire range of electric field intensities, the FET can have lower noise factors all over the operational region.

The conventional FETs have the mutual conductance characteristic with respect to changes of a gate voltage Vg that the mutual conductance gm has a peak with a specific gate voltage value. But the PET according to this invention has the mutual conductance characteristic that the mutual conductance gm retain a peak value with respect to a wide range to gate voltages, because the electron channel transfer speed is high over the entire range of electric field intensities. According to this invention, a FET can be easily designed. The resultant FET can have stable characteristics, always secure high gains, and provide outputs without distortions.

In the FET according to this embodiment, the cap layer 108 of AlInAs and the second active layer 106 are spaced from each other by a distance which is larger than a spread of a wave function of the electrons in the active layer 106. Accordingly the deterioration of high-frequency characteristics due to space transition does not occur, as does in a conventional HEMT in which an AlInAs layer having inferior electron transfer characteristics is adjacent to an active layer.

It has been conventionally considered that a quantum well for accumulating channel electrons cannot be prepared unless an active layer is formed in two-dimensional plane as in a planared FET. Accordingly the impurity doping amount in the planared doped FET is $1 \times 10^{13}/cm^3$ at most. But in this embodiment it is possible to form quantum wells as described above while the active layers have some thickness. Accordingly the active layers 104, 106 can be doped with impurities in high concentration. The channel can be formed with a large number of electrons.

Specifically, in the FET according to this embodiment, it can be secured that the impurity doping amount for the channel is $8 \times 10^{13}/cm^2$ per one active layer at smallest. This is because even when a doping amount per one atom film (per 5-6 Å) is estimated low at $5 \times 10^{12}/cm^2$, the thickness of 100 Å of each active layer 104, 106 can secure that impurity doping amount. Thus, the FET according to this invention can provide far more channel electrons than the planared doped FET, and larger drain current can be provided. In comparison with the conventional HEMT, whose current drive capacity is restricted by an upper limit of a two-dimensional electron gas concentration, far superior current drive capacity can be available.

Since the gate electrode 113 is in Schottky contact with the cap layer of undoped AlInAs, higher Schottky barriers can be obtained. Consequently, it is possible to operate the device on high-barrier conditions, which provides improved output characteristics.

As described above, according to this invention, while a low-intensity electric field is being applied between the drain and the source, the electrons generated in the first and the second active layers, which contain impurities in high concentrations, are present with high probability in the second undoped layer between these active layers, which contains no impurity and has good electron transfer characteristic. When an high-intensity electric field is applied between the drain and the source, the electrons moving through the channel are energized and transfer to the first and the third semiconductor layers having good electron transfer characteristic, which sandwich the first and the second active layers. The first and the second active layers have some thickness which allows for doping impurities in high concentrations, with the result that the channel can be formed of a large amount of electrons.

Thus, a FET having good current drive capacity can be provided without lowering electron speed through the channel. Accordingly the FET according to this embodiment is effectively applied to the basic structures of devices for high outputs at high frequencies and low noises.

The fabrication process for the FET according to this invention will be explained with reference to FIGS. 3A-3F. The epitaxial growth is conducted by MBE (Molecular Beam Epitaxial Growth) or OMVPE (Organometal Vapor-Phase Epitaxial Growth).

Figure 3A:
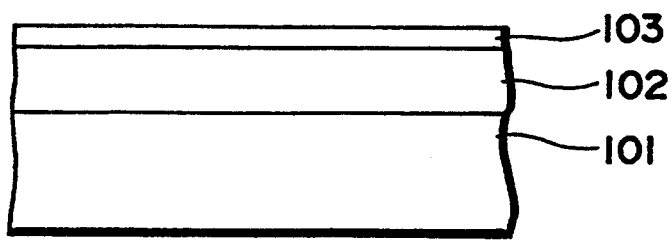
FIGS. 3A to 3F are sectional views of the FET of FIG. 2 according to the first embodiment in the respective step of the fabrication process for the same.

First, undoped AlInAs is epitaxially grown in a thickness of 1 μm as the buffer layer on the semiconductor substrate 101. Then as the first undoped layer 103, $In_yGa_{1-y}As$ ($0.45 \leq y \leq 0.65$) is epitaxially grown in a thickness of 100 Å (FIG. 3A). In this epitaxial growth, a III group element material (e.g., trimethyl gallium) is fed in a larger amount than a V group element material (e.g., $ASH_3$: Alsine) so that the first undoped layer 103 is background $p^-$ conduction.

Figure 3B:
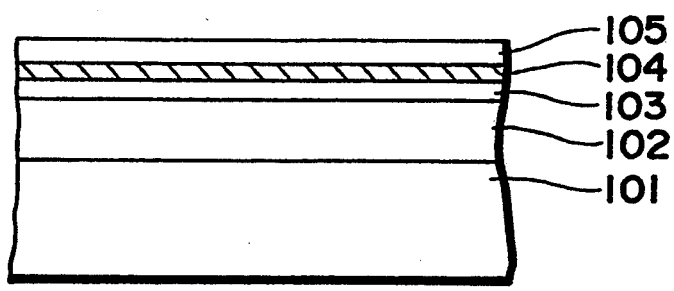

On the first undoped layer 103, $n^+$ $In_yGa_{1-y}As$ ($0.45 \leq y \leq 0.65$) doped with Si in a concentration of $2 \times 10^{18}/cm^3$ is epitaxially grown as the first active layer 104 in a 100 Å-thickness. Then as the second undoped layer 105, $In_yGa_{1-y}As$ ($0.45 \leq y \leq 0.65$) is epitaxially grown in a thickness of 100 Å (FIG. 3B). In this epitaxial growth, a V group element material is fed in a larger amount than a III group element so that the second undoped layer 105 has background $n^-$ conduction.

Figure 3C:
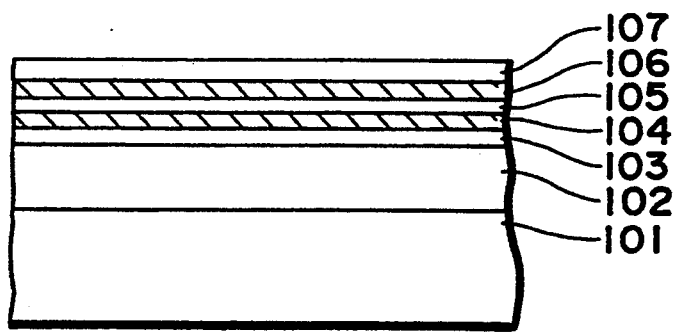

Subsequently the second active layer 106 is grown in the same way as the first active layer 104. Furthermore, the third undoped layer 107 is grown in the same way as the second undoped layer 105 (FIG. 3C).

Figure 3D:
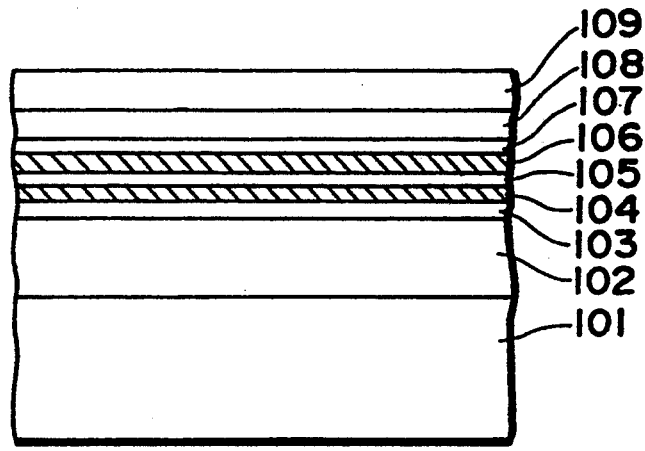

Undoped $Al_xIn_{1-x}As$ ($0.4 \leq X \leq 0.6$) is epitaxially grown in a 200 Å-thickness as the cap layer 108 which is to be in Schottky contact with the gate electrode. On the cap layer 108, $n^+$ InGaAs doped with a donor in a concentration of $4 \times 10^{18}/cm^3$ is epitaxially grown in a thickness of 500 Å (FIG. 3D).

Figure 3E:
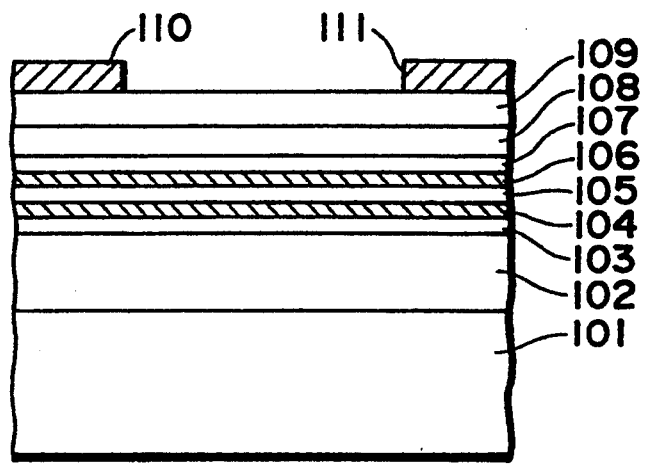
Figure 3F:
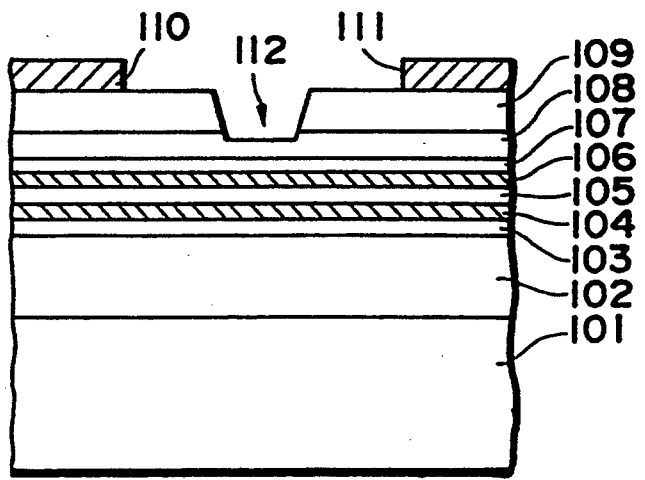

Then AuGe/Ni metal is formed on the uppermost contact layer 109. Next, an ohmic electrode pattern is formed by the usual photolithography to form the drain electrode 110 ad the source electrode 111 which are in ohmic contact with the contact layer 109 (FIG. 3E). Then a pattern for the gate electrode is formed by the same usual lithography. With this pattern as the mask, that part of the contact layer 109 at the center between the drain electrode 110 and the source electrode 111 is selectively etched off, and the recess-etched groove 112 which reaches the cap layer 108 is formed (FIG. 3F).

Then a gate electrode 113 of Ti/Pt/Au metal is formed in Schottky contact with that part of the cap layer 108 exposed in the recess-etched groove 112. And a FET of FIG. 2 is formed.

The materials of the respective layers of the FET according to this invention are not essentially limited to those used in the above-described embodiment. In the above-described embodiment, the first, the second and the third undoped layers 103, 105, 107 are formed of undoped InGaAs, but their materials are not essentially limited to them and may be, e.g., undoped InP.

The case where the semiconductor substrate 101 is formed of GaAs will be explained. To lattice-match with the substrate 101, the buffer layer 102 is formed of undoped GaAs and has a thickness of 1 μm. The first undoped layer 103 is formed of udoped $In_yGa_{1-y}AS$ ($0 \leq y \leq 0.35$) which has better electron transfer characteristic than the active layers 104, 106. It is preferable that the first undoped layer has a thickness of about 50 Å for the prevention of dislocations due to lattice defects.

The first active layer and the second active layer 106 are formed respectively of $n^+$ $In_yGa_{1-y}AS$ ($0 \leq y \leq 0.35$) doped with Si in a $2 \times 10^{18}/cm^3$ and respectively have a thickness of 100 Å. The second undoped layer 105 sandwiched by the active layers 104, 106 is formed of undoped $In_yGa_{1-y}AS$ ($0 \leq y \leq 0.35$) having better electron transfer characteristic than the active layers 104, 106 and has a 100 Å-thickness.

The third undoped layer 107 on the second active layer 106 is formed of the same material as the second undoped layer 105 and has a thickness of 100 Å. The cap layer 108, which has hetero junction with the third undoped layer 107 is formed of undoped $Al_xGa_{1-x}As$ ($0 \leq X \leq 0.3$) and has a thickness 200 Å. The contact layer 109 on the cap layer 108 is formed of doped n+ InGaAs doped with a donor in a concentration of $4 \times 10^{18}/cm^3$ and has a thickness of 500 Å.

The materials of the respective layers of the FET according to this invention are not essentially limited to those used in the above-described embodiment. In the above-described embodiment, the first, the second and the third undoped layers 103, 105, 107 are formed of undoped InGaAs, but their materials are not essentially limited to them and may be, e.g., undoped InP. The other conditions and the fabrication techniques are the same as in the above-described embodiment.

Figure 4:
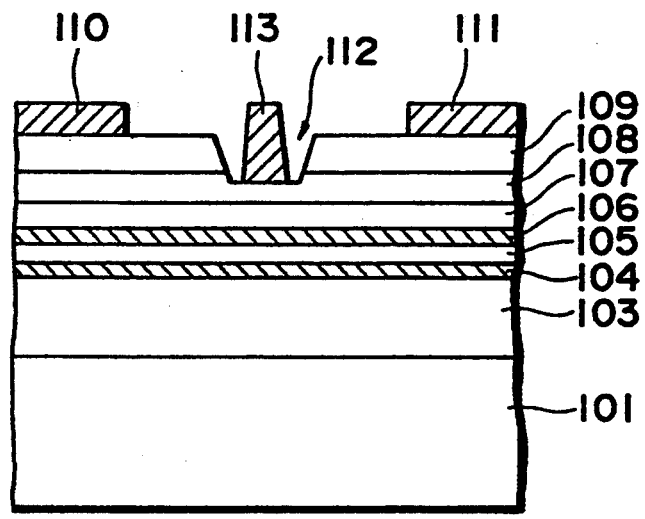
FIG. 4 is a sectional view of the FET according to a second embodiment of this invention, having the recess structure of the first embodiment from which the buffer layer is omitted.

In the above-described embodiment, the buffer layer 102 and the cap layer 108 are formed, but depending on selected materials and required characteristics, structure having these layers omitted. FIG. 4 shows, in comparison with the first embodiment, a sectional view of the FET according to this invention a second embodiment of this invention having the buffer layer omitted.

A first undoped layer 103, a first active layer 104, a second undoped layer 105, a second active layer 106 a third undoped layer 107, a cap layer 108 and contact layers 109 are epitaxially grown on a semiconductor layer 101 in the stated order. A gate electrode 113 is formed in recess-etched groove 112 in the center between the contact layers 109, which reach the cap layer 108. A drain electrode 110 and a source electrode 111 are formed on the contact layers 109 sandwiching the gate electrode 113.

Then the respective layers will be explained. The first undoped layer 103 on the semiconductor substrate 101 is formed of undoped InP having better electron transfer characteristic than the active layers 104, 106 and has thickness of 1 μm. The first active layer 104 and the second active layer 106 are formed respectively of n+InP doped with Si in a concentration of $2 \times 10^{18}/cm^3$ and respectively have a thickness of 100 Å. The second undoped layer 105 sandwiched by the active layers 104, 106 is formed of Inp having better electron transfer characteristic than the active layers 104, 106 and has a thickness of 100 Å. The third undoped layer 107 formed on the second active layer 106 is formed of the same material as the second undoped layer 105 and has a thickness of 200 Å. The cap layer 108 is formed of undoped $Al_xIn_{1-x}As$ with an Al composition ratio X of 0.4–0.6 ($0.4 \leq X \leq 0.6$) and has a thickness of 200 Å. The contact layers 109 are formed of n+ InGaAs doped with a donor in a concentration of $4 \times 10^{18}/cm^3$ and has a thickness of 500 Å.

In the above-described embodiments, the cap layer 108 of AlInAs is formed on the third undoped layer 107 of InP, but it is generally considered difficult to maintain the crystallinity of an interface between AlInAs and InP. In view of this, an undoped InGaAs thin film may be formed between the third undoped layer 107 and the cap layer 108. The first, the second and the third undoped layers 103, 105, 107 are formed of undoped InP, but their materials are not limited to it and can be, e.g., undoped InGaAs.

Next a case where the same layer structure as the second embodiment is formed of different materials will be explained.

The first undoped layer 103 is formed of substantially undoped p− GaAs having better electron transfer characteristic than the active layers 104, 106 and has a thickness of 1 μm. The first active layer 104 and the second active layer 106 are formed respectively of n+ GaAs doped with Si in a concentration of $2 \times 10^{18}/cm^3$ and respectively have a thickness of 100 Å. The second undoped layer 105 sandwiched by the active layer 104 and the active layer 106 is formed of substantially undoped n− GaAs having better electron transfer characteristic than the active layers 104, 106 and has a thickness of 100 Å. The third undoped layer 107 on the second active layer 106 is formed of the same material as the second undoped layer 105 and has a thickness of 200 Å. The cap layer 108 is formed of substantially undoped n− $Al_xGa_{1-x}As$ with an Al composition ratio of 0–0.3 ($0 \leq X \leq 0.3$) and has a thickness of 200 Å. The contact layers 109 on the cap layer 108 are formed of n+ GaAs doped with a donor in a concentration of $4 \times 10^{18}/cm^3$ and has a thickness of 500 Å.

Figure 5:
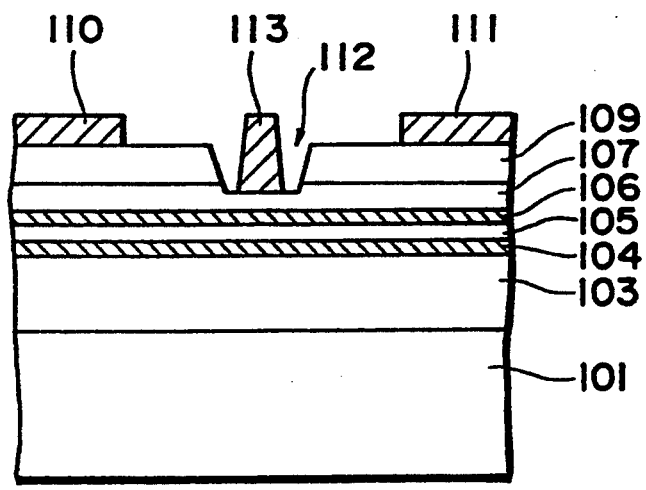
FIG. 5 is a sectional view of the FET according to a third embodiment of this invention, having the recess structure of the first embodiment from which the buffer layer and the cap layer are omitted.

FIG. 5 shows a sectional view of the FET according to a third embodiment of this invention, which has the buffer layer 102 and the cap layer 108 omitted.

A first undoped layer 103, a first active layer 104, a second undoped layer 105, a second active layer 106, a third undoped layer 107 and contact layers 109 are epitaxially grown on semiconductor layer 101 in the stated order. A gate electrode 113 is formed in a recess-etched groove in the center between the contact layers 109, which reaches the third undoped layer 107. A drain electrode 110 and a source electrode 111 are formed on the contact layers 109 sandwiching the gate electrode 113.

The respective layers will be explained. The first undoped layer 103 on the semiconductor substrate 101 is formed of undoped p− GaAs having better electron transfer characteristic than the active layers 104, 106 and has a thickness of 1 μm. The first active layer 104 and the second active layer 106 are formed of n+ GaAs doped with Si in a concentration of $2 \times 10^{18}/cm^3$ and respectively have a thickness of 100 Å. The second undoped layer 105 sandwiched by the active layers 104, 106 is formed of substantially undoped n− GaAs having better electron transfer characteristic than the active layers 104, 106 and has a thickness of 100 Å. The contact layers 109 on the second active layer 106 is formed of the same material as the second undoped layer 105 and has a thickness of 200 Å. The contact layers 109 on the third undoped layer 107 are formed of n+ GaAs doped with a donor impurity in a concentration of $4 \times 10^{18}/cm^3$.

In this embodiment the first, the second and the third undoped layers 103, 105, 107 are formed of undoped GaAs, but their materials are not essentially limited to it and may be, e.g., undoped InGaAs.

In this embodiment the active layers 104, 105 are formed of GaAs, but may be formed of InP or InGaAs. In this case, the respective undoped layers sandwiching the active layers are formed of undoped Inp or undoped InGaAs.

The active layers, and the undoped layers sandwiching the active layers may not be essentially formed of the same material. Any material can be used as long as it has good electron transfer characteristics and substantially lattice-matches with the active layers. In the case that the active layers are formed of InP, the respective undoped layers sandwiching the active layers of InP are formed of undoped InGaAs. In the case that the active layers are formed of InGaAs, the respective undoped layers may be formed of Inp.

The embodiments which have been so far described above are MESFETs having recess structures in the gate electrode regions. But in their commercial fabrication, the recess structure has some problems in terms of uniformity and reproducibility. In view of this, a FET having a structure which can be fabricated by a simpler process and is suitable to be integrated will be described below.

Figure 6:
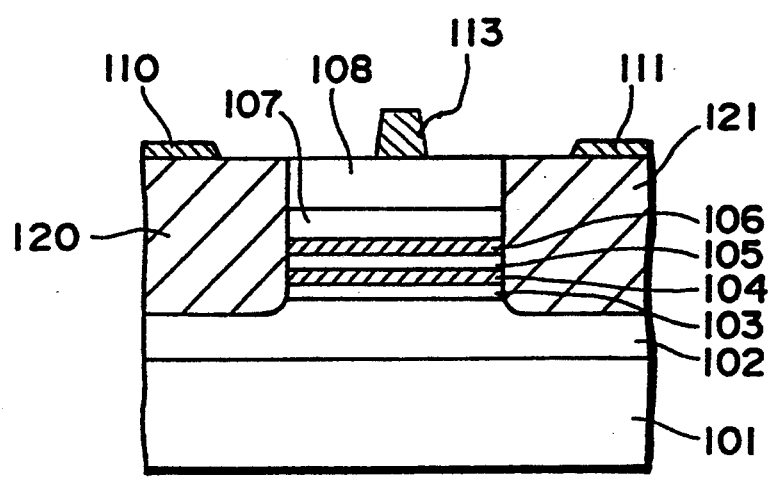
FIG. 6 is a sectional view of the FET according to a fourth embodiment of this invention, having the recess structure of the first embodiment replaced by a planar structure.

FIG. 6 shows a sectional structural view of the FET according to a fourth embodiment of this invention, which has a planar structure. This embodiment corresponds to the first embodiment of FIG. 2 whose contact layers are replaced by ion-injected layers (regions). This structure will be explained with reference to FIG. 6.

A buffer layer 101, a first undoped layer 103, a first active layer 104, a second undoped layer 105, a second active layer 106, a third undoped layer 107 and a cap layer 108 are epitaxially grown on a semiconductor substrate 101 in the stated order. A gate electrode 113 is formed on the cap layer 108 at the substantially central part. On both sides of the gate electrode 113 are formed the ion-injected layers 120, 121 which are extended through the cap layers 108 down to the buffer layer 102. A drain electrode 110 and a source electrode 111 are formed respectively on the ion-injected layers 120, 121.

FIGS. 7A to 7F shows sectional views of the FET according to the fourth embodiment in the respective steps of the fabrication process therefor. The epitaxial growth is conducted by the crystal growing techniques, such as MBE (Molecular Beam Epitaxy) and OMVPE (Organometal Vapor-Phase Epitaxy), etc.

Figure 7A:
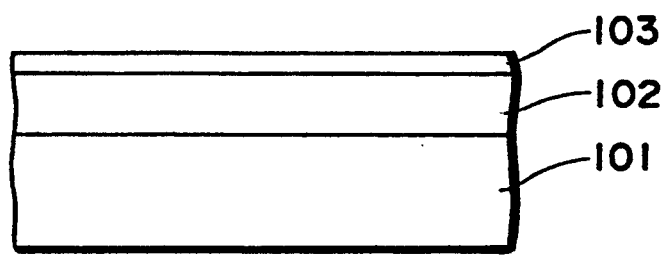
FIGS 7A to 7F are sectional view of the FET according to the fourth embodiment in the respective step of the fabrication process for the same.

First, the buffer layer 102 is grown on the semiconductor substrate 101, and then the first undoped layer 103 is epitaxially grown (FIG. 7A). In this epitaxial growth, the first undoped epitaxial layer 103 is epitaxially grown to have background $p^-$ conduction by controlling a ratio between feed amounts of a V-group material and a III-group material.

Figure 7B:
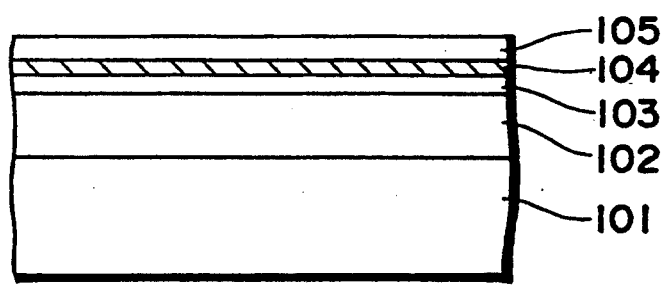
Figure 7C:
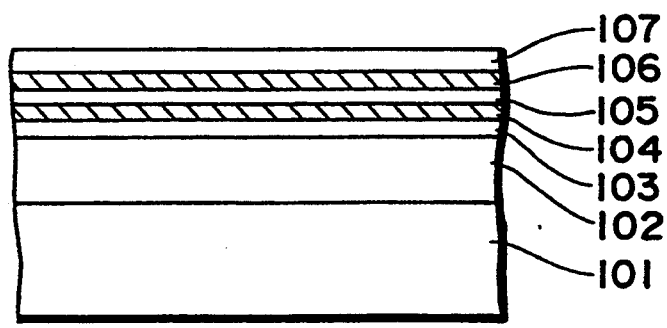

Then the first active layer 103 with a high carrier density is epitaxially grown on the buffer layer 102. Subsequently on this first active layer 103 is epitaxially grown the second undoped layer 104 of background $n^-$ conduction (FIG. 7B).

Figure 7D:
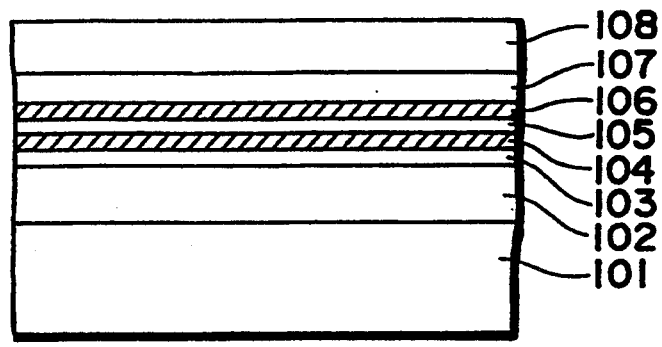

Next, the second active layer 105 is formed on the second undoped layer 104. On this active layer 105 is epitaxially grown the second undoped layer 104 of background $n^-$ conduction (FIG. 7D).

Figure 7E:
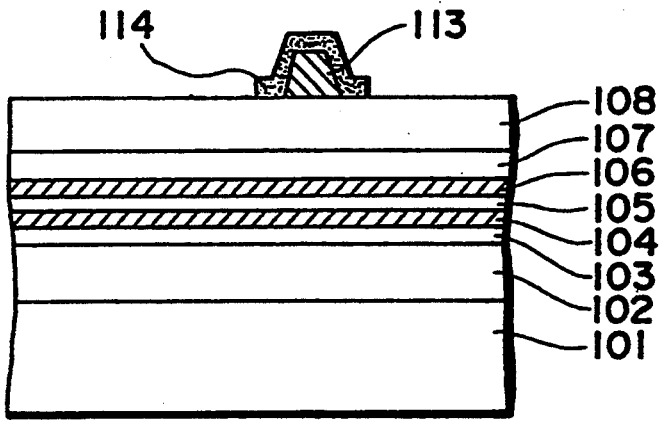
Figure 7F:
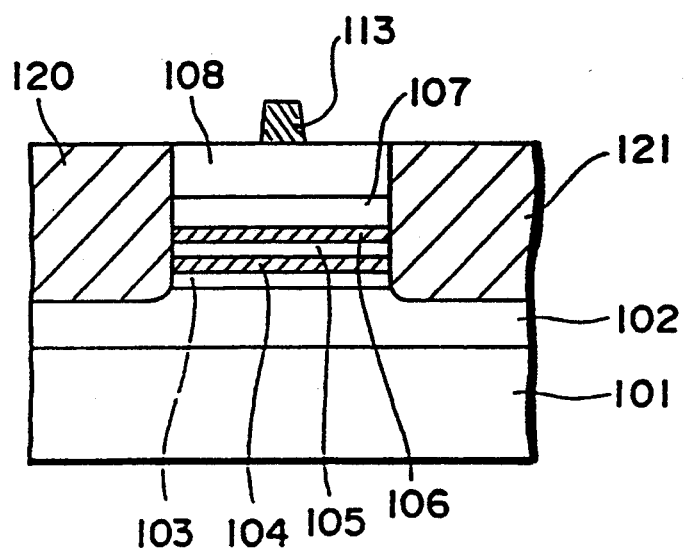

Then the gate electrode 113 is formed on the epitaxial wafer of this laminar structure by vaporization, lithography, etching, etc. Subsequently, an oxide or others 114 is formed on the side wall of the gate electrode 113 (FIG. 7E). With this oxide or others 114 as the mask, Si ions are selectively injected into the surface of the substrate. This ion-injection forms the $n^{30}$ Si-ion injected layers 120, 121 (FIG. 7F). In this ion injection, the ion-injected layers 120 and 121 are spaced from the gate electrode 113. In this method, ion injection is performed after the formation of the gate. But after the ion injection is performed to form the $n^+$ and perform heat-treatment to make the injected ion active, the gate may be formed.

The drain electrode 110 and the source electrode 111 are formed in ohmic contact with the respective ion-injected layers 120, 121 by the same vaporization, lithography etc. This electrode formation completes the MESFET of FIG. 1.

Because the gate electrode 113 is formed on the planar cap layer, the disadvantage of the FET having a recess structure in the gate electrode region, i.e., low fabrication yields due to the disuniformity and poor reproducibility resulting from the recess etching, can be eliminated.

By the background p-conduction of the first undoped layer 103, and the background $n^-$ conduction of the second and the third undoped layers 104, 106, more carriers can be present on the side of the surface of the substrate, i.e., the side of the gate electrode 113. As a result, good control by a gate voltage can be obtained.

The materials, dopants, doping concentrations, layer thickness, etc. of the respective layers are the same as in the first embodiment and the variation of the materials.

Figure 8:
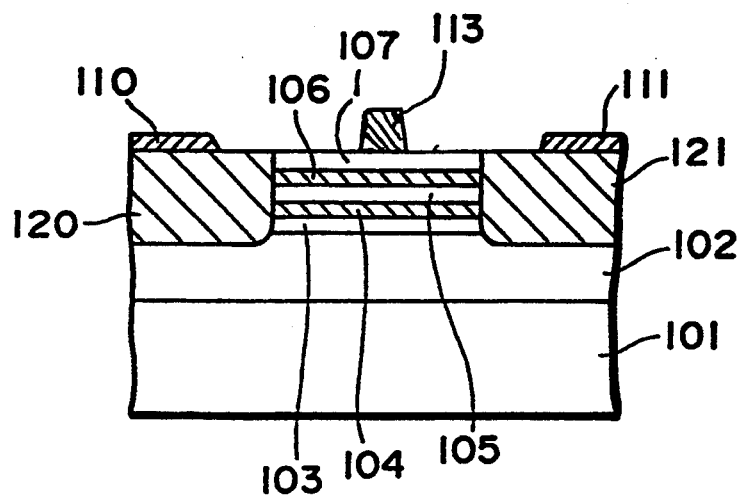
FIG. 8 is a sectional view of the FET according to a fifth embodiment of this invention, having the planar structure of the fourth embodiment from which the buffer layer is omitted.
Figure 9:
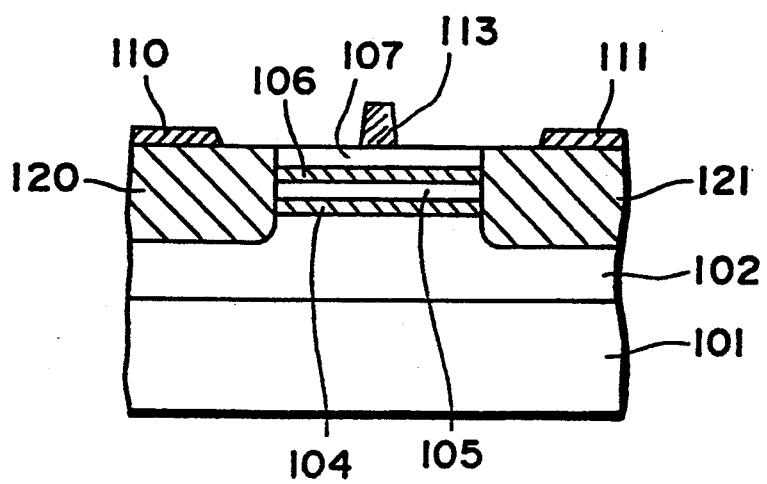
FIG. 9 is a sectional view of the FET according to a sixth embodiment having the planar structure of the fourth embodiment from which the buffer layer and the cap layer are omitted.

FIG. 8 shows a sectional structural view of the MESFET corresponding to the second embodiment having a planar structure. FIG. 9 shows a sectional structural view of the MESFET corresponding to the third embodiment having a planar structure. In these sectional structural views, the same reference numerals as in the sectional structural view of FIG. 4 are used to represent members having the same functions as in the latter. The fabrication processes for these MESFETs are the same as the fabrication process for the FET of FIG. 4 except that the step of growing the buffer layer for the MESFET of FIG. 8 and the steps of growing the buffer layer and the cap layer for the MESFET of FIG. 9. The materials, dopants, doping concentrations, layer thickness, etc. of the respective layers are the same as in the second and the third embodiments, and their variations of their materials.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

What is claimed is:

1. A field-effect transistor of a compound semiconductor comprising a channel structure having:
    a first semiconductor layer formed of a material, the first layer containing substantially no impurity;
    a second semiconductor layer formed of the same material as the first semiconductor, the second layer being grown on the first semiconductor layer, and substantially lattice-matched with the first semiconductor layer, and containing in a high concentration an impurity which makes the second semiconductor layer n type conduction, and having a thickness above 60 Å;
    a third semiconductor layer formed of the same material as the first semiconductor layer, the third layer being grown on the second semiconductor layer, and substantially lattice-matched with the second semiconductor layer, and containing substantially no impurity;
    a fourth semiconductor layer formed of the same material as the first semiconductor layer, the fourth layer being grown on the third semiconductor layer, and substantially lattice-matched with the third semiconductor layer, and containing in a high concentration an impurity which makes the fourth semiconductor layer n type conduction, and having a thickness above 60 Å;
    a fifth semiconductor layer formed of the same material as the first semiconductor layer, the fifth layer being grown on the fourth semiconductor layer, and substantially lattice-matched with the fourth semiconductor layer, and containing substantially no impurity;

a gate electrode;

a source electrode and a drain electrode electrically isolated, and sandwiching the gate electrode.

2. A field-effect transistor according to claim 1, wherein the third semiconductor layer has a thickness of 50 -300 Å.

3. A field-effect transistor according to claim 1, further comprising:

contact layers formed on the fifth semiconductor layer, said contact layers being in ohmic contact with the source electrode and with the drain electrode, and being isolated by a recess groove formed between the source electrode and the drain electrode.

4. A field-effect transistor according to claim 3, wherein the gate electrode is formed on the bottom of the recess groove in Schottky contact with the fifth semiconductor layer.

5. A field-effect transistor according to claim 1, further comprising:

a first and a second ion-injected region which are electrically isolated from each other, the first ion-injected region being in ohmic contact with the source electrode and the second ion-injected region being in ohmic contact with the drain electrode, wherein ions are injected at the surface of the fifth semiconductor layer down to at least the first semiconductor layer.

6. A field-effect transistor according to claim 5, wherein the gate electrode is in Schottky contact with that part of the fifth semiconductor layer between the two ion-injected regions.

7. A field-effect transistor according to claim 1, further comprising:

a cap layer formed of a material different from the material of the first semiconductor layer, said cap layer being formed directly on the fifth semiconductor layer and having a hetero-junction with the fifth semiconductor layer.

8. A field-effect transistor according to claim 7, further comprising:

a first and a second contact layer formed on the cap layer, the first contact layer being in ohmic contact with the source electrode and the second contact layer being in ohmic contact with the drain electrode, and the contact layers being electrically isolated by a recess groove formed between the source electrode and the drain electrode.

9. A field-effect transistor according to claim 8, wherein the gate electrode is formed on the bottom of the recess groove in Schottky contact with the cap layer.

10. A field-effect transistor according to claim 7, further comprising:

a first and a second ion-injected region which are electrically isolated from each other, the first ion-injected region being in ohmic contact with the source electrode and the second ion-injected region being in ohmic contact with the drain electrode, wherein ions are injected at the surface of the fifth semiconductor layer down to at least the first semiconductor layer.

11. A field-effect transistor according to claim 10, wherein the gate electrode is in Schottky contact with that part of the cap layer between the two ion-injected regions.

12. A field-effect transistor according to claim 7, wherein the second and the fourth semiconductor layers are formed of $In_xGa_{1-x}As$ ($0.45 \leq X \leq 0.65$), and the cap layer is formed of $Al_yIn_{1-y}As$ ($0.4 \leq y \leq 0.6$).

13. A field-effect transistor according to claim 7, wherein the second and the fourth semiconductor layers are formed of $In_xGa_{1-x}As$ ($0 \leq X \leq 0.35$), and the cap layer is formed of $Al_yIn_{1-y}As$ ($0 \leq y \leq 0.3$).

14. A field-effect transistor according to claim 7, wherein the second and the fourth semiconductor layers are formed of InP, and the cap layer is formed of $Al_yIn_{1-y}As$ ($0.4 \leq y \leq 0.6$).

15. A field-effect transistor according to claim 7, wherein the second and the fourth semiconductor layers are formed of GaAs, and the cap layer is formed of $Al_yGa_{1-y}As$ ($0 \leq y \leq 0.3$).

16. A field-effect transistor according to claim 1, wherein the first semiconductor layer is background $p^-$ conduction, and the third and the fifth semiconductor layers are background $n^-$ conduction.

17. A field-effect transistor according to claim 1, wherein:

said fifth semiconductor layer is formed directly on said fourth semiconductor layer;

said fourth semiconductor layer is formed directly on said third semiconductor layer;

said third semiconductor layer is formed directly on said second semiconductor layer; and said second semiconductor layer is formed directly on said first semiconductor layer.

18. A field-effect transistor of a compound semiconductor, said transistor comprising:

a substrate with a main surface; and a channel region provided between a gate electrode and the substrate, and having a stacked structure formed in a vertical direction with respect to the main surface of the substrate, the channel region including:

a first semiconductor layer formed of a material, the first layer containing substantially no impurity;

a second semiconductor layer formed of the same material as the first semiconductor layer, the second layer being grown on the first semiconductor layer, and substantially lattice-matched with the first semiconductor layer, and containing, in a high concentration, an impurity which makes the second semiconductor layer n type conduction, and having a thickness above 60 Å;

a third semiconductor layer formed of the same material as the first semiconductor layer, the third layer being grown on the second semiconductor layer, and substantially lattice-matched with the second semiconductor layer, and containing substantially no impurity;

a fourth semiconductor layer formed of the same material as the first semiconductor layer, the fourth layer being grown on the third semiconductor layer, and substantially lattice-matched with the third semiconductor layer, and containing, in a high concentration, an impurity which makes the fourth semiconductor layer n type conduction, and having a thickness above 60 Å; and a fifth semiconductor layer formed of the same material as the first semiconductor layer, the fifth layer being grown on the fourth semiconductor layer, and substantially lattice-matched with the fourth semiconductor layer, and containing substantially no impurity.

19. A field-effect transistor according to claim 18, wherein:
- said fifth semiconductor layer is formed directly on said fourth semiconductor layer;
- said fourth semiconductor layer is formed directly on said third semiconductor layer;
- said third semiconductor layer is formed directly on said second semiconductor layer; and
- said second semiconductor layer is formed directly on said first semiconductor layer.

20. A field-effect transistor according to claim 18, further comprising:
- a gate electrode provided on the fifth semiconductor layer in Schottky barrier contact with the fifth semiconductor layer; and
- a source electrode and a drain electrode electrically isolated, and sandwiching the gate electrode.

21. A field-effect transistor according to claim 18, further comprising:
- a cap layer formed directly on the fifth semiconductor layer and having a hetero-junction with the fifth semiconductor layer;
- a gate electrode formed directly on the cap layer in Schottky barrier contact with the cap layer; and
- a source electrode and a drain electrode electrically isolated, and sandwiching the gate electrode.

* * * * *